US009620139B2

(12) United States Patent
Philippe et al.

(10) Patent No.: US 9,620,139 B2
(45) Date of Patent: Apr. 11, 2017

(54) ADAPTIVE LINEAR PREDICTIVE CODING/DECODING

(75) Inventors: Pierrick Philippe, Melesse (FR); David Virette, Munich (DE); Claude Lamblin, Tregastel (FR)

(73) Assignee: Orange, Paris (FR)

( * ) Notice: Subject to any disclaimer, the term of this patent is extended or adjusted under 35 U.S.C. 154(b) by 677 days.

(21) Appl. No.: 13/807,657

(22) PCT Filed: Jun. 17, 2011

(86) PCT No.: PCT/FR2011/051393
§ 371 (c)(1),
(2), (4) Date: Dec. 28, 2012

(87) PCT Pub. No.: WO2012/001260
PCT Pub. Date: Jan. 5, 2012

(65) Prior Publication Data
US 2013/0103408 A1 Apr. 25, 2013

(30) Foreign Application Priority Data
Jun. 29, 2010 (FR) ..................................... 10 55206

(51) Int. Cl.
*G10L 21/00* (2013.01)
*G10L 19/06* (2013.01)
(Continued)

(52) U.S. Cl.
CPC .............. *G10L 21/00* (2013.01); *G10L 19/06* (2013.01); *G10L 19/18* (2013.01)

(58) Field of Classification Search
USPC ....... 704/219, 211, 500, 201, 258, 225, 261; 341/76; 375/233, 231; 714/701
See application file for complete search history.

(56) References Cited

U.S. PATENT DOCUMENTS 4,328,585 A * 5/1982 Monsen ............... H04B 7/0851 375/233
5,533,052 A * 7/1996 Bhaskar .............. G10L 19/0212 341/76
(Continued)

FOREIGN PATENT DOCUMENTS

FR 2 762 464 A1 10/1998

OTHER PUBLICATIONS

Linear Predictive Coding With Modified Filter Structures by Aki Harma, IEEE transactions on speech and audio Nov. 2001 processing.*
(Continued)

*Primary Examiner* — Pierre-Louis Desir
*Assistant Examiner* — Neeraj Sharma
(74) *Attorney, Agent, or Firm* — Drinker Biddle & Reath LLP

(57) ABSTRACT

A method of coding/decoding of a digital audio signal comprising a succession of consecutive blocks of data, on the basis of a predictive filter. A modified predictive filter is used for the coding of at least one current block, the modified filter being constructed by the combination of: a rear filter calculated for a past block, preceding the current block, and enrichment parameters for the rear filter, which are determined as a function of the signal in the current block and comprising the coefficients of a modifying filter.

18 Claims, 4 Drawing Sheets

(51) Int. Cl.

| | |
|---|---|
| *G10L 13/00* | (2006.01) |
| *G06F 11/00* | (2006.01) |
| *H03M 7/30* | (2006.01) |
| *G10L 19/18* | (2013.01) |

(56) References Cited

U.S. PATENT DOCUMENTS

| | | | | |
|---|---|---|---|---|
| 6,101,464 | A * | 8/2000 | Serizawa | 704/219 |
| 6,327,562 | B1 * | 12/2001 | Proust | G10L 19/18<br>704/201 |
| 6,449,590 | B1 * | 9/2002 | Gao | G10L 19/005<br>704/211 |
| 2002/0016711 | A1 * | 2/2002 | Manjunath | G10L 19/097<br>704/258 |
| 2003/0009325 | A1 * | 1/2003 | Kirchherr et al. | 704/211 |
| 2003/0225576 | A1 | 12/2003 | Li et al. | |
| 2005/0261898 | A1 * | 11/2005 | Van Klinken | H03H 21/0012<br>704/219 |
| 2008/0010062 | A1 * | 1/2008 | Son | G10L 19/20<br>704/219 |
| 2008/0037621 | A1 * | 2/2008 | Higure | H04L 25/0307<br>375/231 |
| 2008/0046233 | A1 * | 2/2008 | Chen | G10L 19/005<br>704/211 |
| 2008/0319740 | A1 * | 12/2008 | Su | G10L 19/09<br>704/225 |
| 2009/0306993 | A1 * | 12/2009 | Wuebbolt et al. | 704/500 |

OTHER PUBLICATIONS

Yeh et al., "An Adaptive Predictor With Cascaded Forward-Backward Structure," IEEE Transactions on Circuits and Systems—II: Express Briefs, vol. 53(8), pp. 773-776 (Aug. 2006).

* cited by examiner

FIG. 6B
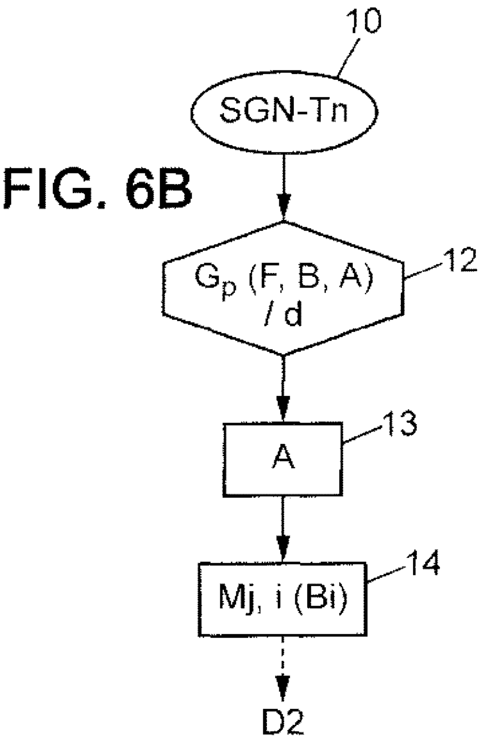
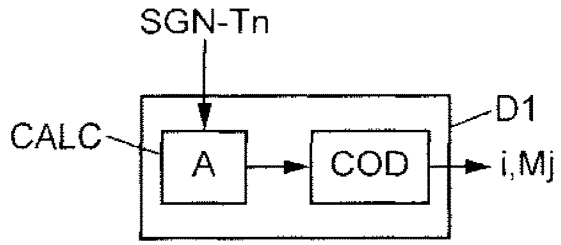
FIG. 6A
FIG. 7B
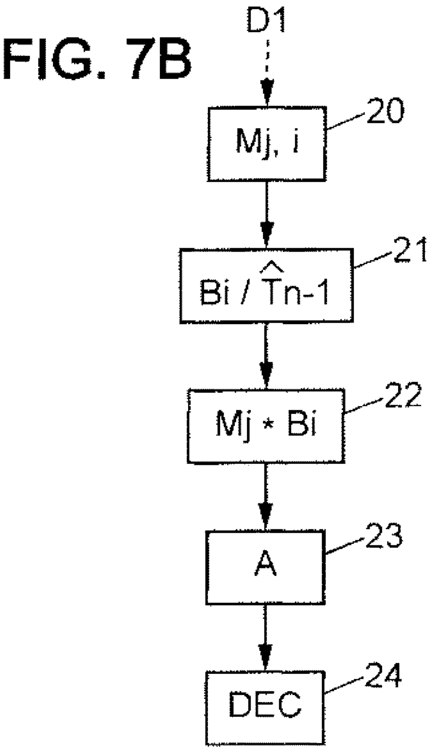
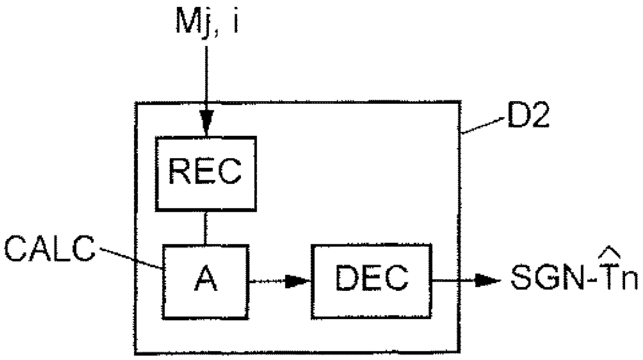
FIG. 7A

ADAPTIVE LINEAR PREDICTIVE CODING/DECODING

CROSS-REFERENCE TO RELATED APPLICATIONS

This application is the U.S. national phase of the International Patent Application No. PCT/FR2011/051393 filed Jun. 17, 2011, which claims the benefit of French Application No. 1055206 filed Jun. 29, 2010, the entire content of which is incorporated herein by reference.

FIELD

The object of the invention relates to the field of coding/decoding audio and/or video data.

BACKGROUND

In one example of application, the invention may relate to coding alternating sounds of speech and music. CELP (Code-Excited Linear Prediction) techniques are generally recommended for effectively coding speech signals alone or superposed with any sound.

CELP coders are predictive coders whose purpose is to model speech production from various elements such as:

- stochastic excitation (e.g. a white noise or algebraic excitation) modeling the flow of air emerging from the lungs in voiced and/or unvoiced periods,
- a long-term prediction for modeling the vibration of vocal chords, in a voiced period in particular, and
- a short-term prediction, in the form of an LPC (Linear Predictive Coding) filter with P coefficients, for modeling changes in the vocal tract, such as the pronunciation of voiced consonants.

This number of coefficients P is chosen in order to fully model the formantic structure of the speech signal. The speech signal generally having four formants in the frequency band 0 to 4 kHz, ten filter coefficients correctly model this structure (two coefficients are needed for modeling each formant).

For a broadband signal sampled at 16 kHz, an LPC order of 16 coefficients is typically used.

The spectrum of a speech signal is shown in FIG. 1 (as a solid line) onto which is superimposed (as a dotted line) the frequency response of an LPC filter modeling its spectral envelope.

A sampled speech signal $s_n$, filtered through such an LPC filter, has a residual signal $r_n$ such that:

$$r_n = s_n - \sum_{i=1}^{P} a_i s_{n-i},$$

$a_i$ being the coefficients of the filter.

The power of the residual signal $r_n$ may be low and its spectrum flattened by a judicious choice of coefficients $a_i$.

The residual signal is then simpler to code than the signal $s_n$ itself. It can easily be modeled by a harmonic, highly periodic, signal, as shown in FIG. 2, where X(f) is the spectrum of the original signal s (black line) and E(f) is the spectrum of the residual signal r (gray line).

The coefficients $a_i$ are typically calculated by measuring the correlation on the signal $s_n$ (and by applying a Levinson-Durbin type algorithm for inverting the Wiener-Hopf equations).

Thus there are two main component elements of CELP codecs:

- a modeling of the vocal tract, via short-term prediction that models the spectral envelope in the form of an LPC filter and
- a modeling of the excitation passing through the vocal tract, whether it is voiced or not.

These two parametric elements, even though they model voice signals correctly, are not intended to faithfully reproduce musical audio or mixed signals (with superpositions of different speech and musical sound elements). In particular, the LPC filter modeling the spectral envelope is no longer suited to the simple voice signal and the excitation no longer fits the voiced/unvoiced model.

Notably in the implementation of the 3GPP AMR WB+ coder, a mixed speech/audio signal coding has been provided, which is improved in particular by better excitation coding. Coding via the LPC envelope is preserved, but the excitation coding is improved.

In addition to modeling by a long-term stochastic excitation predictor, transform coding may be added in cases where sounds do not fit the speech production model. This is termed ‘CELP+TCX’ (Transform Coded eXcitation). One such technique consists of the following steps:

- LPC envelope coding estimation of the signal to be coded with a fixed number of coefficients,
- selection of the excitation model (voiced/unvoiced parametric model or transform coding), and
- transmission of the selected mode, the coded excitation and LPC envelope.

Thanks to this choice of coding for excitation, the quality of the coding by AMR WB+ is satisfactory for audio signals consisting of mixtures of speech with background noise or speech with background music, and therefore typically for signals where speech dominates in energy. Indeed, for these signals, the envelope transmitted in LPC form is a relevant parameter since the signal is mainly composed of speech that is well described thanks to an LPC envelope of a given order. The envelope actually describes the formants (associated with the resonant frequencies of the vocal tract) as a function of the number of selected coefficients.

However, for signals with a low speech signal component—or even for signals not composed mainly of voice—the estimated LPC envelope transmitted to the coder is no longer sufficient. The audio signal is then often too complex to be limited, for example, to five formants and its evolution over time means that a fixed number of coefficients is not suitable.

Thus, for coding a complex sound, due to the limitation in coding the envelope, the coding effort is transferred to coding the excitation and the coder then loses its effectiveness.

One solution would consist in adapting the number of LPC coefficients transmitted over time, for the portions of the audio signal that require high accuracy for the envelope. This approach is, however, not viable since, in a low bitrate coding system, more accurate coding on the envelope would take away from the bitrate available for coding the excitation, and the quality would then not be improved as much.

Another solution would consist in performing a linear prediction with a ‘backward’ analysis such that the estimation of the LPC envelope no longer applies to the signal to be coded but to the previously decoded signal, it being possible for this ‘preceding’ signal to be identically available to the coder and the decoder. A saving can then be made on the transmission of the LPC envelope since it is possible to reconstruct it without information to the decoder, this saving being more useful in modeling the excitation for example. With regard to the coding of musical sounds, this linear prediction with 'backward' analysis can potentially be used to increase the number of filter coefficients modeling the envelope. Typically, an order of 50 can be used for fully modeling a musical signal and enable easy coding of the residual excitation signal.

On the other hand, the use of past information does not allow the changes in the audio signal to be anticipated since using a backward predictor is relevant for a stationary signal but the spectrum at a given frame is only accurately modeled and may be used for a following frame if the statistical and notably the spectral properties of the signal remain stable. Otherwise, the estimated LPC filter is not relevant for the frame considered and the residual signal then remains difficult to encode. The backward predictor therefore loses all its attraction.

A solution recommended in the prior art is therefore to use switching between a 'forward' prediction filter, calculated on the current frame, and a backward prediction filter, calculated on the previously received signal. The encoder analyzes the signal and decides whether the signal is stationary or not. If the signal is stationary, the backward filter is used. Otherwise, a forward filter with few coefficients is transmitted to the decoder. Such an embodiment can be used for accurate control over the quality of the residual signal to be encoded. It is implemented in ITU-T standard G.729-E, in which a decision on the stationarity of the signal results in a 'backward' estimated filter with 30 coefficients, or a 'forward' estimated filter with 10 coefficients.

The drawback of this technique lies mainly in combining these two estimation techniques. A discontinuous choice must be made, depending on the stationarity of the signal. In the case of a 'slight' non-stationarity like the appearance of an instrument in a musical ensemble, this new event should be considered in the signal and therefore a new forward filter should be sent. However, it may nevertheless be considered that the signal is sufficiently stable for the backward filter to be appropriate. Faced with such a dilemma situation, the coding system tends to often change configuration over time, in a relatively unpredictable way, causing distortion. Indeed, changing processing too often over time is not effective and the solution adopted is not necessarily the best.

In summary, the prior art recommends:

- a fixed forward predictor, with few filter coefficients coarsely modeling the envelope,
- a fixed backward predictor with a large number of coefficients, but which cannot model the signal variations from one frame to another,
- alternating between the two types of predictors, which sometimes generates troublesome discontinuities.

SUMMARY

The present invention will improve the situation.

For this purpose it provides a method of coding a digital audio signal comprising a succession of consecutive blocks of data, on the basis of a predictive filter. The method according to the invention comprises in particular the use of a modified predictive filter for coding at least one current block. This modified filter is constructed by the combination of:

- a backward filter calculated for a past block, preceding the current block, and
- enrichment parameters of the backward filter, determined as a function of the signal in the current block and comprising the coefficients of a modifying filter (M).

The invention has a number of advantages: in particular it obviates passing abruptly from a backward filter to a forward filter, but can, for example, offer the possibility of a transition via such a modified filter notably between the use of a backward filter and that of a forward filter. It also avoids passing through a forward filter with few coefficients for coding a stationary signal with a complex envelope while this is only slightly disturbed by a non-stationarity.

Another advantage is that of enriching a backward filter by producing an optimum quality of coding without necessarily transmitting a complete forward filter, in particular with as many coefficients, for example, as a forward filter.

Another advantage, in fact, is that of enabling more choice to the coder with different categories of filters: backward, forward and modified.

The enrichment parameters comprise the coefficients of a modifying filter, and the modified filter is constructed by a combination of backward filter and modifying filter.

This combination may be, in an example of embodiment described below, a convolution of the backward filter by the modifying filter. As a variant, in another space, it may involve a multiplication, for example, or other.

Such an embodiment has the advantage of simplifying the calculation operations with a decoder receiving the aforementioned parameters.

Thus, in one embodiment, the method may comprise, for coding a current block, a choice based on at least one predetermined criterion, of a predictive filter among at least:

- a backward filter calculated for a past block, preceding the current block, and
- a forward filter, suitable for the current block, and
- a modified filter, estimated on the basis of a backward filter and as a function of the signal in the current block.

This criterion may, for example, take into account a stationarity of the signal between the past block and the current block, for the choice of one of the filters from among a backward filter, a forward filter and a modified filter.

In a particular embodiment, the predetermined criterion may comprise an estimate of a prediction gain based on a relationship between the power of the signal in the current block and the power of a residual signal after this signal is filtered using each of the backward, forward and modified filters. Such an embodiment will be described in detail further on, notably in reference to FIGS. 4 and 5.

The aforementioned criterion may further take into account a number of parameters to be sent to a decoder for decoding a current block and comprising at least the coefficients that the filter to be chosen comprises. Thus, in such an embodiment, the predetermined criterion may comprise a search for the optimum between:

- the prediction gain offered by a filter to be chosen, on the one hand, and
- a bitrate suitable for transmitting the necessary parameters to a decoder for reconstructing this filter.

Thus, since a choice can be made for the type of filter to be used, it is therefore possible to base this choice on the order of the filter to be chosen and, in a particular embodiment, the method then comprises the following steps:

a) determining a plurality of forward filters of distinct respective orders, b) determining a plurality of backward filters of distinct respective orders, c) calculating a plurality of modified filters of distinct respective orders, each estimated on the basis of a backward filter determined in step b) and as a function of the signal in a current block to be coded, d) comparing, for the same number of parameters to be sent to a decoder, this number being determined as a function of the filter orders, the performance of at least two filters from among the forward filters, backward filters and modified filters determined in steps a), b) and c), and e) selecting, for coding a current block, a predictive filter with the best performance according to the comparison of step d), for a given number of parameters to be sent to a decoder.

The modifying filter may be estimated by any technique, as for example:

by deconvolution of a forward filter suitable for filtering the current block, by said backward filter calculated for a past block, or on the basis of an analysis of a residual signal obtained after filtering of the current block by the aforementioned backward filter, or by identification in the least squares sense, by calculating autocorrelation terms of the backward filter coefficients and intercorrelation between the modified filter and the backward filter.

Once the coefficients of the modifying filter are determined by one of these techniques, the method may further comprise an information message to a decoder, of the type:

choice of a forward filter for a current block, with a transmission of parameters representing coefficients of the forward filter, or choice of a backward filter or a modified filter for a current block, with, in the case of a choice of a modified filter, a transmission of parameters representing coefficients of the modifying filter.

The present invention is then also aimed at a method of decoding a digital audio signal comprising a succession of consecutive blocks of data, the method using a predictive filter for decoding a current block, the method comprising in particular:

a reception of information for calculating a modified predictive filter based on the combination of:

a backward filter calculated for a past block, preceding the current block, and enrichment parameters of the backward filter, originating from the information received comprising filter coefficients, for forming a modifying filter (M) comprising said coefficients.

Finally, the method of decoding may then comprise a step in which, for decoding at least one given current block, the predictive filter thus modified is rather used.

For example, this combination may consist of a multiplication or a convolution (or other) of the backward filter by the modifying filter.

Of course, for other current blocks, the decoder may also use a backward filter or a forward filter, according to the information received from the coder.

In particular, on decoding, the backward filter may be reconstructed on the basis of previously decoded data. For example, it is possible to use the residual signal that the decoder has received from the coder for a past block, if the order of the backward filter to be reconstructed is higher than a previously constructed filter for this past block.

The method of decoding may thus comprise the following steps for determining the backward filter:

determining an order of the backward filter, as a function of said received information, and estimating the backward filter from previously decoded data and by using this filter order.

The 'filter order' information may be transmitted directly from a coder to the decoder, or consist of implicit information. For example, in the latter case, the decoder may be programmed for calculating a backward filter of N1 coefficients if a modified filter has to be constructed and calculating a backward filter of N2 coefficients, for example, if it is planned only to use a single backward filter for decoding.

Thus, the invention provides a combination of backward filter and a modifying filter chosen for complementing and for creating a modified filter of better quality than the backward filter, since it is a version of the backward filter enriched by an update originating from characteristics drawn from the current block. According to one of the advantages of the invention, the signal envelope is accurately described (for any type of signal), with an optimum transmission rate, whether in the form of a forward filter, a backward filter or a modified filter. In addition, the transition between filters (whether forward, backward or modified) takes place smoothly compared with the prior art and thus the discontinuity effect previously described with reference to prior art is avoided.

The coding quality resulting from the use of the invention is thus improved.

BRIEF DESCRIPTION OF THE DRAWINGS

Other characteristics and advantages of the invention will emerge on scrutiny of the detailed disclosure below, and the accompanying drawings in which.

DETAILED DESCRIPTION

Figure 1:
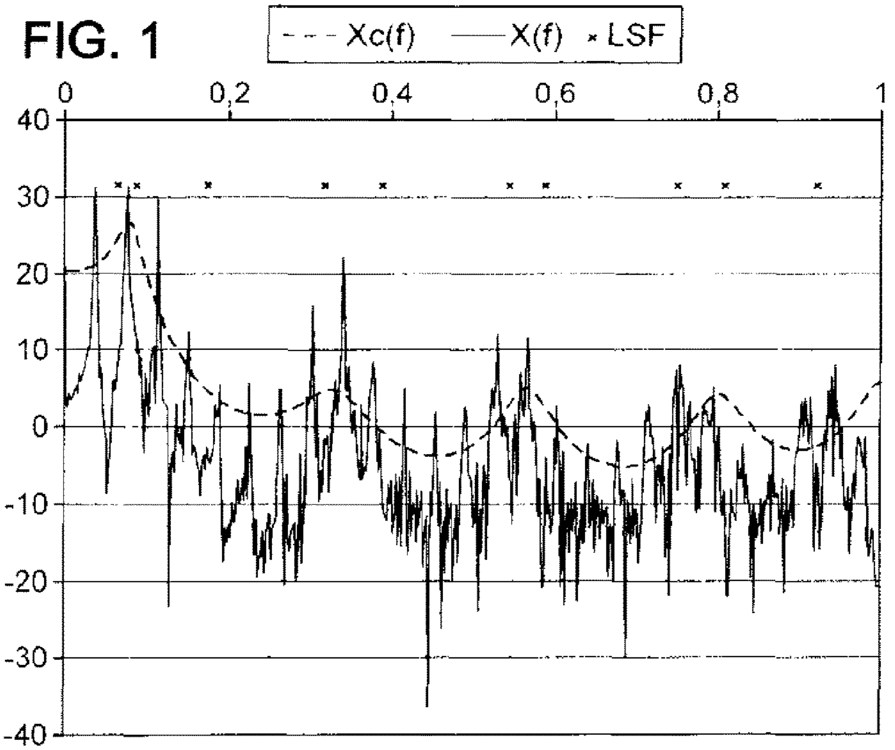
FIG. 1 shows the spectrum of a speech signal onto which is superimposed the frequency response of an LPC filter modeling its spectral envelope, FIG. 2 schematically illustrates a harmonic, highly periodic, signal, where X(f) is the spectrum of the original signal s and E(f) is the spectrum of the residual signal r, FIG. 3 schematically illustrates a succession of signal blocks in frame form, for choosing a filter appropriate notably for coding the signal.
Figure 2:
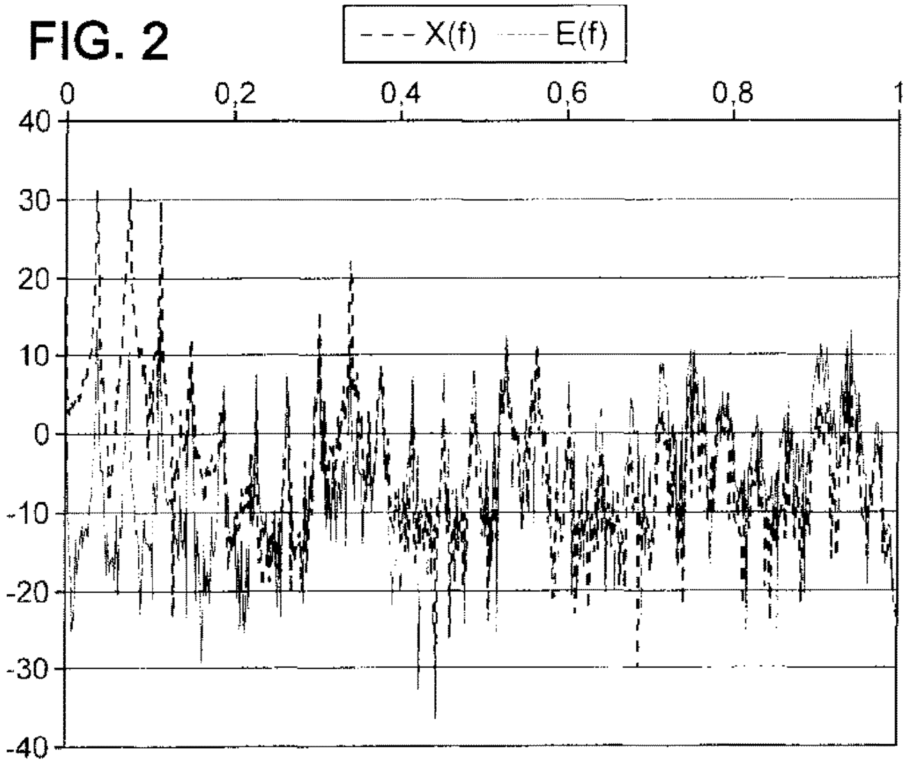

The notations used in what follows are defined thus:

$F_i$ for a forward filter of order i, $B_i$ for a backward filter of order i, $A_i$ for a modified filter of order i, thus corresponding to an enriched version of a backward filter $B_j$ via the use of a modifying filter disclosed in detail further on, and $M_i$ for a modifying filter of order i.

The example of embodiment disclosed below falls within the framework of a coding using LPC (Linear Predictive Coding) filters. This technique may therefore be of the CELP type, e.g. according to the standards G.729, AMR, AMR-WB, or using a supplementary coding transform, e.g. according to the standards G.718, G.729.1, AMR WB+, MPEG-D (Unified Speech and Audio Coding).

In a system based on LPC filters, filtering is intended to separate the signal to be coded into two components:

- the spectral envelope, modeled by this filter composed of its P coefficients $a_i$, and
- the residual signal remaining to be coded (and corresponding to a signal more efficiently transmitted because of its reduced spectral envelope), as follows:

$$r_n = x_n - \hat{x}_n = x_n - \sum_{i=1}^{P} a_i x_{n-i}$$

where $r_n$ here expresses the residual signal, calculated on the input audio signal $x_n$, by convolution with the filter coefficients $a_i$.

This equation can be expressed through its z transform, denoted by:

$$E(z) = X(z)\left[1 - \sum_{i=1}^{P} a_i z^{-i}\right] = X(z)A(z)$$

The LPC filter A(z) is thus of the form:

$$A(z) = 1 - \sum_{i=1}^{P} a_i z^{-i}$$

The number P designates the number of non-zero coefficients. It is termed the 'filter order'. Usually, a judicious number for a speech signal in narrow band (sampled at 8 kHz) is 10. This order may nevertheless be increased in order to better model the signal spectrum and notably to enhance the accuracy of its envelope. It can also be increased if the signal sampling rate is higher.

The residual signal may also be presented in the perceptual weighted domain. Thus, instead of applying the LPC ($a_i$) filter as is, a modification of this filter is used in order to better take into account the properties of the human ear during residual coding. Typically, a perceptual weighting is used, using the filter W(z):

$$W(z) = A(z/\gamma)\left(\text{or } W(z) = \frac{A(z/\gamma_1)}{A(z/\gamma_2)}\right)$$

where $\gamma$, $\gamma_1$, $\gamma_2$ are real-value coefficients typically between 0.9 and 1.

The coefficients $a_i$ of the LPC filter are commonly estimated by identifying the audio signal and its prediction made in the least squares sense. Therefore the coefficients $a_i$ are sought for minimizing the quadratic error of the past audio signal, through the filter A(z). Hence the aim is to minimize the power of the signal $r_n$. This power is estimated over a certain duration representing a number of samples N. The coefficients are therefore valid for this period of time. This estimate of LPC filter coefficients is thus achieved by estimating the autocorrelation terms of the signal $x_n$, and by solving the Yule Walker or Wiener Hopf equations, typically by a fast Levinson Durbin algorithm type, as described, for example, in the reference:

"Linear prediction: A tutorial review", John Makhoul, Proceedings of the IEEE, 63 (5): 561-580, April 1975.

Other algorithms may, however, be used for estimating the coefficients $a_i$, e.g. by spectral estimation or by the covariance method.

The estimation of the LPC filter coefficients can be performed on the current signal $x_n$, on a frame representing a set of samples, or on a version of the signal $x_m$ (m<n) resulting from a preceding local (complete or partial) decoding of the signal in coded form. The local decoding is obtained by decoding the encoded parameters in the encoder. This local decoding can be used to retrieve information from the coder that is usable by the decoder in exactly the same way.

Figure 3:
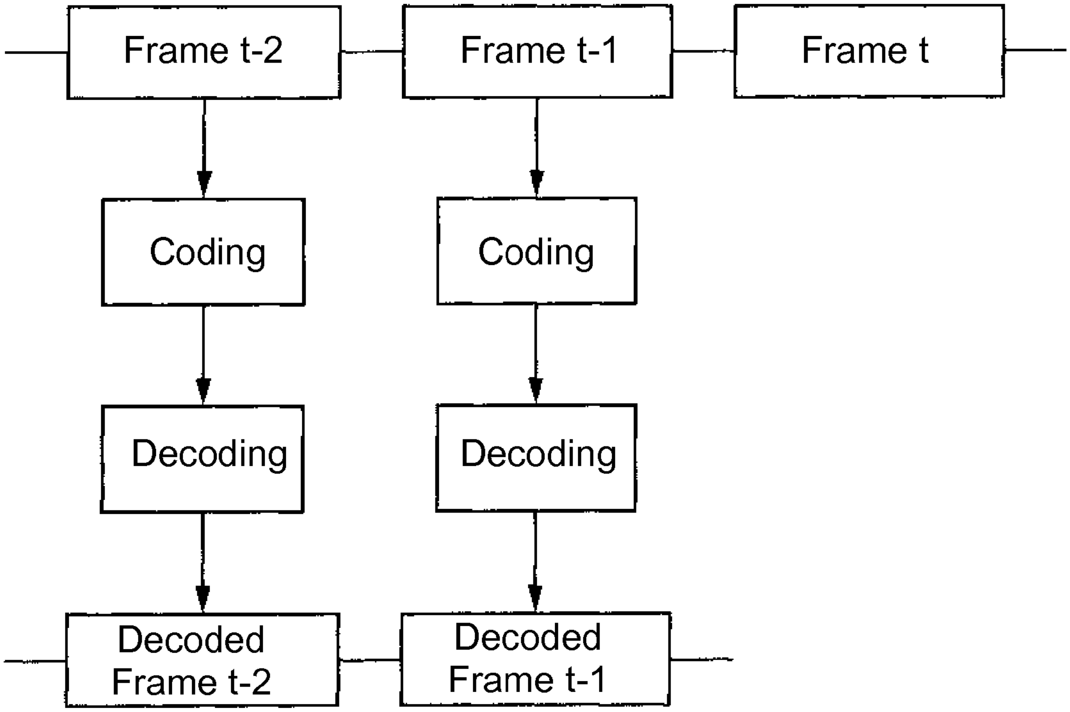

FIG. 3 provides a description of how to use the information available for calculating the LPC filter:

- the LPC filter is calculated on the original samples of the current frame (frame t), or previous frames (t−1, t−2, etc.): in such cases, this means a 'forward' LPC filter and its coefficients (denoted below by $f_n$) must be communicated to the decoder, or
- the LPC filter can be calculated from locally decoded samples, therefore prior to the current frame (t−1, t−2, etc.): in this case, it is a 'backward' LPC filter and the decoder is also capable of estimating the coefficients (denoted by $b_n$) of the same LPC filter, which does not therefore need to be communicated to the decoder.

The performance of the LPC filter, or a weighted version of it, may then be evaluated by estimating the power of the residual signal (i.e. the signal power resulting from filtering the original signal of the current frame by the LPC filter considered). The ratio of the original signal power divided by the residual signal power provides a quantity called 'prediction gain', often expressed in dB.

The following table shows a numerical example giving the prediction gains obtained for the forward and backward filters for different orders.

In this embodiment, the LPC filters are estimated in forward mode on the current frame and in backward mode on the decoded preceding frame. Their specific prediction gain is then calculated. The orders used range from p=4 to p=32 in the table below.

| | p | | | | | |
|---|---|---|---|---|---|---|
| | 4 | 8 | 16 | 20 | 24 | 32 |
| forward | | 6.19 | 7.45 | 8.30 | 8.59 | 9.15 |
| backward | 5.63 | 5.71 | 6.74 | 7.33 | 7.51 | 7.97 |

Thus it can be seen that the gain of the forward LPC filter is always better than the gain of the backward LPC filter for a given order. This observation is explained by the fact that the backward LPC filter is not suitable for processing the current frame, but rather the preceding frame. However, it often happens (as in the case presented here as an example), in particular when the signal is actually stationary, that the gain of a backward LPC filter is higher than the prediction gain of a backward LPC filter of a lower order. In the example of the table above, the prediction gain is greater in backward mode with an order of 24, than in forward mode with an order of 10 or 16.

Thus it will be understood that it is advantageous to choose the backward LPC filter of order 24 (b24) over the forward filter of order 10 (f10) for coding. In addition, the filter f10 requires the transmission of its coefficients to the decoder, whereas the filter b24 can be calculated in the decoder without the need to transmit additional information.

Nevertheless, the filter b24 has a prediction gain much lower than the prediction gain of the filter f24 (although a forward filter of the same length).

Thus, this embodiment provides for not basing the representation of the LPC filter solely on a backward filter, but adding a modifying filter (M) to it, transmitted to the decoder. The LPC filter finally used (A) then stems from the combination of the backward filter (B) and the modifying filter M, as follows:

$$A(z)=M(z)B(z)$$

This filter A, hereafter referred to as the 'modified filter', is then used in the coder (possibly weighted) for calculating the residue. An inverted version (1/A(z)) of this filter is used in the decoder for reshaping the spectrum of the signal.

Different embodiments are possible for calculating the modifying filter M.

In a first approach, the modifying filter may be calculated in a conventional manner using the Levinson Durbin algorithm acting on the signal originating from filtering the signal of the current frame by the determined backward filter.

Thus, in more generic terms, the modifying filter may be determined on the basis of an analysis of a residual signal obtained after filtering of the current block by a backward filter calculated for a past block.

In a second approach, the modifying filter M may be calculated by approximation of a target forward filter of equivalent order. Indeed, if q is the order of the modifying filter M and r the order of the backward filter B, it is possible to determine, for the current frame, the modified filter A of order p=q+r−1. The modifying filter (M) may be estimated by 'deconvolution'.

Indeed, it may be estimated, for example, according to a first option, by deterministic deconvolution, then calculating the filter 1/B(z) (by polynomial division) that is multiplied by the filter F(z) for obtaining a filter M whose product with the backward filter B gives an approximation of the frequency response of the filter F: the filter B(z) being derived from an LPC analysis, the inverse filter 1/B(z) is therefore stable and can then be inverted.

Thus, in generic terms, the modifying filter may be estimated, according to this first option, by deconvolution of a forward filter suitable for filtering the current block, by a backward filter calculated for a past block.

According to a second option, the modifying filter may be estimated by a Wiener identification method in the least squares sense in which the autocorrelation terms of the backward filter ($r_0$, $r_1$, $r_{q-1}$) are calculated, as well as the intercorrelation between the target forward filter and the backward filter ($c_0$, $c_1$ . . . $c_{q-1}$), the filter M then being obtained by the following matrix product:

$$\begin{bmatrix} m_0 \\ m_1 \\ m_2 \\ \\ m_{q-1} \end{bmatrix} = \begin{bmatrix} r_0 & r_1 & \cdots & r_{q-2} & r_{q-1} \\ r_1 & r_0 & r_1 & \cdots & r_{q-2} \\ \vdots & r_1 & r_0 & r_1 & \vdots \\ r_{q-2} & \vdots & r_1 & \ddots & r_1 \\ r_{q-1} & r_{q-2} & \cdots & r_1 & r_0 \end{bmatrix} \begin{bmatrix} c_0 \\ c_1 \\ c_2 \\ \\ c_{q-1} \end{bmatrix}$$

Thus, in generic terms, this second option may be implemented by identification in the least squares sense, by calculating autocorrelation terms of the backward filter coefficients and intercorrelation between the modified filter and the backward filter.

The second option may be implemented in practice by a fast algorithm (of the type used for the identification of LPC coefficients and based on autocorrelation of the signal). However, the first option of deconvolution may be also advantageous.

The filter M obtained via any one of these techniques is then quantified typically in a form appropriate to the transmission of LPC filter coefficients (e.g. by using a conversion of the LSF, LSP ('Line Spectral Frequencies' or 'Pairs') or ISF type). Once quantified, these coefficients are convoluted in the backward filter B for obtaining a filter A(z) which may be reproduced identically in the decoder.

Then, the performance of the filter obtained is compared with those of the quantified forward filter (F) containing the same number of coefficients as the calculated filter M. If the number of bits used for transmitting a filter depends only on the length of the filter (which is often the case in speech/audio coding), then the performance between filter A and filter F can be directly compared via their prediction gain, calculated on the original signal $x_n$. Thus:

if filter A has a coding gain greater than filter F, then filter M is transmitted, and if not, filter F is transmitted.

Preferably, since filter A is of a higher order than filter F (thus making it expensive to estimate in the decoder as it involves the estimation of filter B and the decoding of filter M), filter A is only selected if its prediction gain is far greater than that of filter F (of a few dB).

It has been disclosed above how a forward filter could be constructed from a chosen backward filter.

Now it is disclosed how to choose a 'backward filter or forward filter originating from this backward filter' entity from among several possibilities.

One embodiment presented below therefore considers the calculation of a plurality of backward, forward and modifying filters.

Thus several orders of backward filters (B) $pb_0$, $pb_1$, $pb_2$, $pb_3$, . . . are calculated.

Also several orders of quantified forward filters (F) $pf_0$, $pf_1$, $pf_2$, $pf_3$, . . . are calculated.

The number of forward filters is not necessarily identical to the number of backward filters.

For a determined set of backward filters, a set of quantified modifying filters is calculated, according to the method presented previously. It is wise to choose modifying filters having orders identical to the orders of the forward filters F already calculated ($pf_0$, $pf_1$, $pf_2$, $pf_3$).

The convolution of backward filters (B) and modified filters (M) then gives a set of combined filters (A), whose performance is compared with that of the backward filters (in particular with those of the forward filters having an identical order to the modified filter M).

Figure 4:
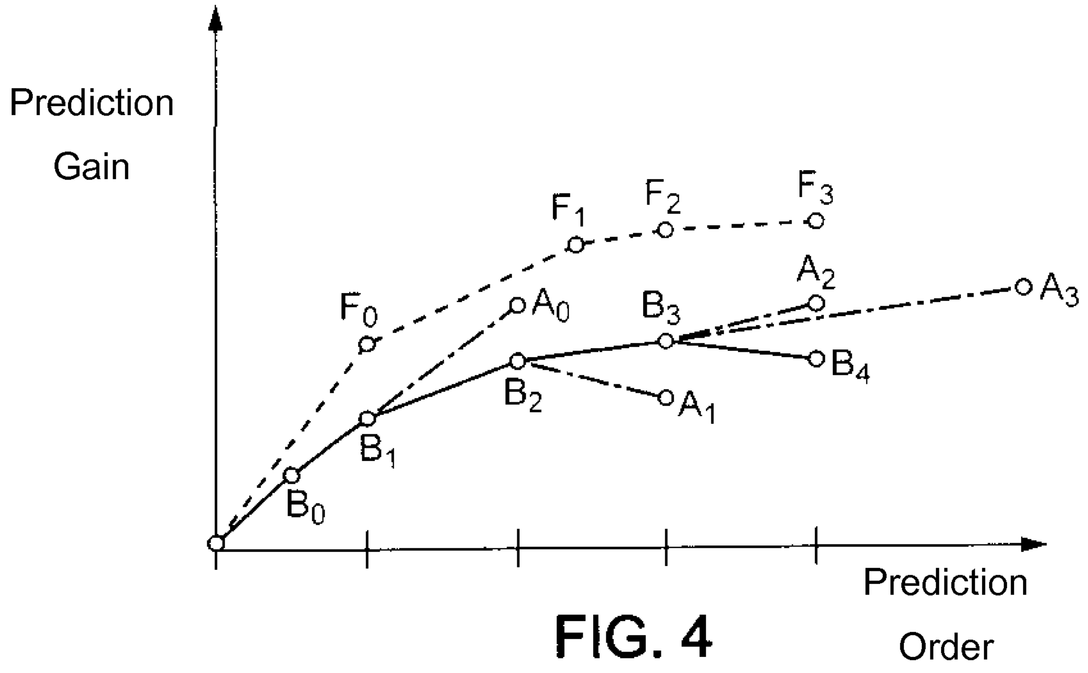
FIG. 4 shows an example of prediction gain offered by the choice of a modified filter $A_i$, or of a backward filter $B_i$, or of a forward filter $F_i$, according to the order of this filter.

FIG. 4 shows the performance of backward filters calculated at 5 different orders (from $B_0$ of order $pb_0$ to $B_4$ of order $pb_4$). It is seen that the filter $B_4$ has a worse performance than the filter $B_3$. This filter, like any backward filter of lesser performance than a lower order backward filter, is immediately eliminated from further consideration. This avoids the unnecessary calculation of modified filters based on this filter $B_4$. Also shown is the performance of backward filters calculated at 4 different orders (from $F_0$ of order $pf_0$ to $F_3$ of order $pf_3$). The abscissa of the graph in FIG. 4 shows the prediction order and the ordinate, the prediction gain.

On the basis of filter $B_1$, a modifying filter ($M_{1,0}$) of order $pf_0$ is calculated for obtaining a first filter $A_0$.

On the basis of filter $B_2$, a modifying filter ($M_{2,0}$) of order $pf_0$ is calculated for obtaining a second filter $A_1$.

On the basis of filter $B_3$, a modifying filter ($M_{3,0}$) of order $pf_0$ is calculated for obtaining a third filter $A_2$.

On the basis of filter $B_3$, a modifying filter ($M_{3,1}$) of order $pf_1$ is calculated for obtaining a fourth filter $A_3$.

The filters $A_0$, $A_1$ and $A_2$ therefore have an identical cost of transmission, since they necessitate the transfer of $pf_0$ coefficients. This transmission cost may be considered identical to that of the filter $F_0$.

Likewise, the transmission cost of the filter $A_3$ is similar to the transmission cost of the filter $F_1$.

By positioning the filters in the bitrate/coding gain plane (FIG. 5), the best possibilities are finally selected for coding the LPC envelope. It appears that the relevant configurations are then the filters $B_3$, $A_0$ or $A_2$, $F_1$, $F_2$ and $F_3$. The other configurations, offering lower performance for the same or a higher bitrate, may therefore be eliminated.

Thus, for a limited bitrate at $d_0$, the filters $A_0$ or $A_2$ may be chosen or the filter $B_3$. Indeed, it appears that these are the filters that offer the best prediction gain for a relatively modest bitrate demand $d_0$.

For this last choice, a complexity criterion may be taken into account, in particular in the decoder, since:

- the choice of filter $A_0$ requires calculating the filter $B_1$ and decoding a modifying filter of order $pf_0$
- the choice of filter $A_2$ requires calculating the filter $B_2$ and decoding a modifying filter of order $pf_0$: this choice therefore involves more complexity than that of the filter $A_0$ for the same performance
- the choice of filter $B_3$ requires calculating a high-order filter $pb_3$ and therefore presents more complexity.

If the solution adopted depends on the complexity allowed in the decoder, in this example the filter $A_0$ is adopted.

In the above embodiment, the same bitrate configurations were compared with each other. Of course, it is also possible to compare configurations having different bitrates. The following relationship is used for this purpose, giving the signal-to-noise ratio of a signal coded by linear prediction:

$$SNR=G_P+6.02d$$

where d represents the number of bits assigned to the transmission of the residue. This number may be estimated, knowing the total bitrate, for coding the audio frame (T), the number of samples that it comprises (N) and the bitrate required for coding the LPC filter (R), as follows:

$$r=(T-R)/N.$$

Thus for comparing two different bitrate configurations, their signal-to-noise ratio may be compared:

$$SNR_2-SNR_1=G_{P2}-G_{P1}+6.02(R_1-R_2)/N.$$

If this quantity is positive, the filter of index 2 will be chosen (otherwise the filter of index 1).

In dynamic operation, the forward/backward/combined filter type may change from one frame to the next, according to the choice made in the coder. However, care will be taken to avoid too rapid changes in configuration if the prediction gains are not sufficiently different, in particular between the configuration used in the preceding frame and the configuration giving the best performance in the current frame.

Typically, a change is only useful beyond a certain threshold (e.g. 1 dB).

In addition, the coder must inform the decoder so that it can calculate the chosen LPC filter. Information useful for this purpose includes, for example:

- the presence of a backward filter B,
- the presence of a forward filter F,
- the order of the backward filter used,
- the order of the forward filter used,
- the order of the modifying filter M,
- the coefficients of the forward filter,
- the coefficients of the modifying filter, However, they are not all necessary for a given configuration. The following three possibilities are conceivable:

- forward filter
- backward filter
- backward filter plus modifying filter.

One effective syntax may be as follows:

| Code | Number of bits | Comment |
|---|---|---|
| if (B) | 1 | presence of the backward filter |
| { | | |
| read index_pb | 2 | order of the backward filter |
| } | | |
| if (F) | 1 | presence of the filter |
| { | | |
| read index_pf | 1 | order of the forward filter or |
| read the | f[pf] | ISF, . . . number of bits, depends on |
| } | | |

In this example, the filter coefficients are assumed to be quantified in their ISF form. They are grouped for being coded together. A typical configuration used in the AMR-WB (3GPP) encoder is included in this example of embodiment. It is 46 bits for 16 LPC coefficients represented in ISF form. For 10 coefficients, 18 bits will rather be used, for example.

Reading the 2-bit indicator index_pb is associated with a corresponding number of filter coefficients. For example, the following association may be provided:

| Index_pb | pB |
|---|---|
| 0 | 4 |
| 1 | 8 |
| 2 | 16 |
| 3 | 32 |

Likewise, the indicator index_pf can be represented in a single bit:

| Index_pf | pB |
|---|---|
| 0 | 10 |
| 1 | 16 |

If filter B is to be estimated, the coefficients $f_n$ are interpreted as the coefficients of the filter modifying the backward filter. Otherwise the coefficients $f_n$ are interpreted as forward filter coefficients.

The syntax shown above can be adapted, or even simplified, if the number of combinations is reduced. For example, the field index_pb may be omitted if only a single order of backward filter is considered possible. For example, if filter B has to be transmitted, the order of the backward filter may be implicitly set to 16. Likewise, for the forward filter F or modifying filter M, a single length may be considered, e.g. 16.

The syntax is then simplified as follows:

| Code | number of bits | Comment |
|---|---|---|
| B | 1 | presence of the backward filter |
| if (F) | 1 | presence of the filter |
| { | | |
| read the | f[pf] | ISF, . . . 16 coefficients |
| } | | |

In decoding, the decoder, on reading the information indicating the use of the backward filter and its order, calculates the backward filter of the order indicated on the previously decoded samples.

Upon reception of the indication of presence and of the order of a filter, it decodes the ISF indices transmitted for converting the filter into LPC filter coefficients. Of course, here, if only the backward filter is reported (without ISF indices), the decoder understands that the filter used is finally only the backward filter (B). If the two filters are transmitted (with the ISF indices), the decoder understands that the filter used is the 'modified' filter A (obtained by convolution of the forward and backward filters (B*M), filter M being interpreted as the modifying filter).

If only the forward filter is transmitted with its order, the decoder understands that the filter used is the forward filter alone.

Thus, the present invention provides an alternative to LPC envelope coding, a critical element for coding quality notably in audio coding. Due to the light syntax provided, an alternative mode of LPC envelope coding does not cause any difficulty compared with current techniques: the coder can always choose the standard forward LPC mode, as a fallback position. Likewise, as in the prior art, the decoder is capable of using backward filters, notably when the signal is stationary. Nevertheless, it is also capable of taking advantage of both approaches by combining them. Thus, the performance of the LPC filter is further enhanced by increasing its accuracy and so improving quality.

In contrast to the prior art, the fact of supplementing a backward filter with a modifying filter causes less sudden variations in the processing of frames (no more sudden forward/backward switching from one frame to the next). This again delivers an improvement in quality.

The present invention is also aimed at a signal encoding device for implementing the above method of coding. One example of embodiment is shown in FIG. 6A and such a coder D1 comprises for example:

- means CALC for calculating a modified filter A on the basis of a backward filter and at least as a function of the signal in the current block SGN-Tn (in a current frame Tn, for example), and
- means of coding COD at least one current block using this modified filter A.

Thus, referring to FIG. 6B, the encoding device, on the basis of a signal SGN in a current frame Tn at step 10, determines a prediction gain Gp for a given bitrate d, by considering several types of forward F, backward B and modified A filters and at step 12 adopts the filter displaying, for example, the best prediction gain at this given bitrate d. If the best candidate filter is a modified filter (step 13), the construction of this involves a modifying filter Mj, the order j of this modifying filter being able to be chosen as a function of the order i of the backward filter Bi on the basis of which the modified filter A is constructed. In step 14, the coefficients of the modifying filter Mj and the order i of the filter Bi can then be sent to a decoding device D2.

The present invention is also aimed at a computer program comprising instructions for implementing these steps, when this program is executed by a processor, e.g. of such an encoding device D1. Thus, the flow chart shown in FIG. 6B may illustrate the general algorithm of such a program.

The present invention is also aimed at the decoding device D2 for decoding an encoded signal for implementing the method of decoding. Referring to FIG. 7A, such a device comprises at least:

- means of reception REC of information (e.g. information representing the coefficients of the modifying filter Mj (in ISF form, for example) and the order i of the backward filter Bi), for calculating a modified predictive filter A,
- means of calculating CALC this modified filter A, based on:
  - a backward filter Bi, calculated for a past block, preceding the current block, and
  - enrichment parameters of the backward filter Bi, originating from the information received,
- and means of decoding DEC at least one current block using the modified filter A.

Thus, referring to FIG. 7B, the decoding device in step 20 receives information (e.g. originating from the coder D1), which information may here comprise:

- the aforementioned enrichment parameters, in the form of coefficients of a modifying filter Mj,
- as well as an order i of a backward filter Bi to be calculated.

At step 21, this backward filter Bi is calculated from previously decoded data (e.g. from a preceding frame $\hat{T}_{n-1}$) and by using the i-th order of filter. At step 22, the modifying filter Mj and the backward filter Bi thus calculated are combined (e.g. by convolution) for obtaining at step 23 the modified filter A used in decoding the signal by the decoding device D2 (step 24), for a current frame to be delivered $\hat{T}_n$.

The present invention is also aimed at a computer program comprising instructions for implementing these steps, when this program is executed by a processor, e.g. of such a decoding device D2. Thus, the flow chart shown in FIG. 7B may illustrate the general algorithm of such a program.

The program for implementing the encoding method (FIG. 6B) and the program for implementing the method of decoding (FIG. 7B) may be grouped together within the same general computer program according to the invention.

Of course, the present invention is not limited to the embodiment described above as an example; it extends to other variants.

Figure 5:
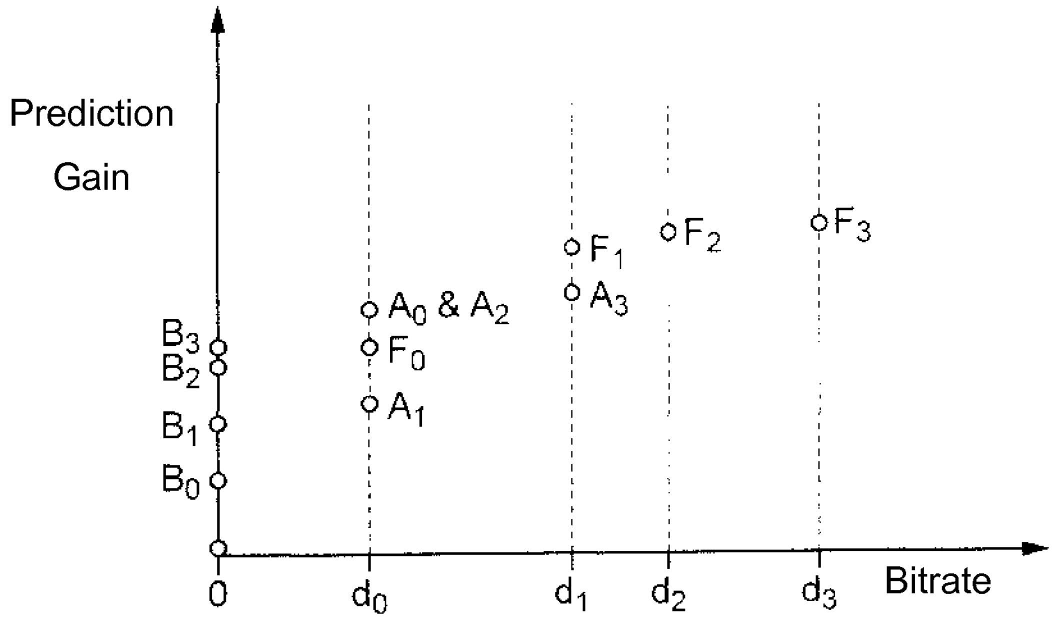
FIG. 5 shows an example of prediction gain offered by a filter according to the bitrate called for by the choice of this filter, necessary for the transmission of its coefficients (or of its enrichment parameters for a backward filter to be transmitted, for example, in the form of ISF indices for a modified filter $A_i$, as will be seen in an example of embodiment disclosed below), FIG. 6A schematically illustrates an encoding device in an embodiment of the invention, FIG. 6B schematically illustrates the steps of a method of encoding in an embodiment of the invention, FIG. 7A schematically illustrates a decoding device in an embodiment of the invention, FIG. 7B schematically illustrates the steps of a method of decoding in an embodiment of the invention.

Thus, for example, the criterion for choosing a filter illustrated in FIG. 5 may not simply be limited to the best prediction gain for a given bitrate. In addition to the threshold in dB to be set for passing from a backward filter to a modified filter (or a modified filter to a forward filter) without audible perception for a user, another criterion which could be taken into consideration might be the complexity of the calculations to be conducted in the coder or decoder. Thus, referring again to FIG. 5, modified filters $A_0$ et $A_2$ are the best candidates at the bitrate $d_0$. Filter $A_0$ will then be preferably selected, less complex than the filter $A_2$, but still offering the same performance in terms of prediction gain.

The invention claimed is:

1. A method of coding a digital audio signal comprising use of a modified predictive filter, for coding at least one current block of a succession of consecutive blocks of data, and wherein the method comprises the steps of:

inputting digital audio data comprising said digital audio signal;

calculating a backward filter for a past block, wherein the past block precedes the current block, determining coefficients of a modifying filter, as a function of said digital audio signal in the current block, combining said coefficients of said modifying filter with coefficients of said backward filter so as to generate information for calculating the modified predictive filter, constructing said modified predictive filter using the information;

generating an encoded current block by applying said modified predictive filter to said current block, and sending said encoded current block and the information for calculating the modified predictive filter over a telecommunication network.

2. The method of claim 1, comprising, for coding a current block, a choice based on at least one predetermined criterion of a predictive filter from among at least:

a backward filter, calculated for a past block, preceding the current block, and a forward filter, adapted for the current block, and a modified filter, estimated on the basis of a backward filter and as a function of the signal in the current block.

3. The method of claim 2, wherein said criterion takes into account a stationarity of the signal between the past block and the current block, for the choice of one of the filters from among a backward filter, a forward filter and a modified filter.

4. The method of claim 3, wherein the predetermined criterion comprises an estimate of a prediction gain based on a relationship between the power of the signal in the current block and the power of a residual signal after this signal is filtered using each of said backward, forward and modified filters.

5. The method of claim 3, wherein said criterion further takes into account a number of parameters to be sent to a decoder for decoding a current block and comprising at least the coefficients that the filter to be chosen comprises.

6. The method of claim 5, wherein the predetermined criterion comprises a search for the optimum between:

the prediction gain offered by the filter, and a bitrate adapted for transmitting said parameters.

7. The method of claim 1, comprising the steps of:

a) determining a plurality of forward filters of distinct respective orders, b) determining a plurality of backward filters of distinct respective orders, c) calculating a plurality of modified filters of distinct respective orders, each estimated on the basis of a backward filter determined in step b) and as a function of the signal in a current block, d) comparing, for the same number of parameters to be sent to a decoder, this number being determined as a function of said filter orders, the performance of at least two filters from among said forward filters, said backward filters and said modified filters, and e) selecting, for coding a current block, a predictive filter with the best performance according to the comparison of step d), for a given number of parameters to be sent to a decoder.

8. The method of claim 1, wherein the modifying filter is estimated by deconvolution of a forward filter adapted for filtering the current block, by said backward filter calculated for a past block.

9. The method of claim 1, wherein the modifying filter is determined on the basis of an analysis of a residual signal obtained after filtering of the current block by said backward filter calculated for a past block.

10. The method of claim 1, wherein the modifying filter is estimated by identification in the least squares sense, by calculating autocorrelation terms of the backward filter coefficients and intercorrelation between the modified filter and the backward filter.

11. The method of claim 1, further comprising an information message to a decoder, of the type:

choice of a forward filter for a current block, with a transmission of parameters representing coefficients of the forward filter, or choice of a backward filter or a modified filter for a current block, with, in the case of a choice of a modified filter, a transmission of parameters representing coefficients of said modifying filter.

12. A method of decoding a digital audio signal received from a telecommunication network and comprising a succession of consecutive blocks of data, the method using a predictive filter for decoding a current block, the method comprising:

receiving said succession of consecutive blocks of data;

receiving information for calculating a modified predictive filter, wherein the received information provides modifying filter coefficients for forming a modifying filter;

combining coefficients of a backward filter, calculated for a past block, preceding the current block, and the modifying filter coefficients, so as to generate information for calculating the modified predictive filter, constructing the modified predictive filter using the information, decoding said current block by applying said modified predictive filter to said current block, and outputting of an audio signal obtained by said decoding.

13. The method of claim 12, comprising the following steps for determining the backward filter:

determining an order of the backward filter, as a function of said received information, and calculating the backward filter from previously decoded data and by using said filter order.

14. A signal encoding device for coding a digital audio signal comprising use of a modified predictive filter, for coding at least one current block of a succession of consecutive blocks of data, comprising at least:

means for inputting digital audio data comprising said digital audio signal;

means for calculating a backward filter for a past block, wherein the past block precedes the current block, means for determining coefficients of a modifying filter, as a function of said digital audio signal in the current block, means for generating information for calculating a modified predictive filter on the basis of a backward filter and at least as a function of the signal in the current block by combining said coefficients of said modifying filter with coefficients of said backward filter, means for constructing said modified predictive filter using the information, means for coding at least one current block using said modified predictive filter to generate an encoded current block, and means for sending said encoded current block and the information for calculating the modified predictive filter over a telecommunication network.

15. A signal decoding device for decoding a digital audio signal received from a telecommunication network and comprising a succession of consecutive blocks of data, using a predictive filter for decoding a current block, the device, comprising at least:

means for receiving a succession of consecutive blocks of data;

means for receiving information for calculating a modified predictive filter, wherein the received information provides modifying filter coefficients for forming a modifying filter;

means for combining coefficients of a backward filter, calculated for a past block, preceding the current block, and the modifying filter coefficients, so as to generate information for calculating the modified predictive filter, means for constructing the modified predictive filter using the information, means of decoding at least one current block by applying the modified predictive filter, and means for outputting an audio signal obtained by said decoding.

16. A non-transitory computer-readable medium encoded with a computer program comprising instructions for implementing the method of coding of claim 1, when this program is executed by a processor.

17. A non-transitory computer-readable medium encoded with a computer program comprising instructions for implementing the method of decoding of claim 12, when this program is executed by a processor.

18. The method of claim 5, wherein the predetermined criterion comprises an estimate of a prediction gain based on a relationship between the power of the signal in the current block and the power of the residual signal after this signal is filtered using each of said backward, forward and modified filters.

* * * * *